(12) United States Patent
Yu (10) Patent No.: US 8,723,313 B2
(45) Date of Patent: May 13, 2014

(54) SEMICONDUCTOR PACKAGE STRUCTURE AND METHOD FOR MANUFACTURING THE SAME

(76) Inventor: Wan-Ling Yu, Taipei (TW)

( * ) Notice: Subject to any disclaimer, the term of this patent is extended or adjusted under 35 U.S.C. 154(b) by 246 days.

(21) Appl. No.: 13/350,763

(22) Filed: Jan. 14, 2012

(65) Prior Publication Data

US 2013/0181341 A1    Jul. 18, 2013

(51) Int. Cl.
*H01L 29/40* (2006.01)

(52) U.S. Cl.
USPC .......................................... 257/737; 438/113

(58) Field of Classification Search
USPC .......... 257/737, E23.021, E21.505, 734, 747, 257/748, 673, 772, 779; 438/113, 110, 106, 438/107, 108, 612–619
See application file for complete search history.

(56) References Cited

U.S. PATENT DOCUMENTS

| | | | |
|---|---|---|---|
| 5,353,498 A | 10/1994 | Fillion et al. |
| 5,508,229 A | 4/1996 | Baker |
| 6,991,966 B2 | 1/2006 | Tuominen |
| 7,067,356 B2 | 6/2006 | Towle et al. |

*Primary Examiner* — Julio J Maldonado
*Assistant Examiner* — Robert Bachner
(74) *Attorney, Agent, or Firm* — Lin & Associates IP, Inc (57) ABSTRACT

A semiconductor package structure and a method for manufacturing the same are provided, in which a semiconductor die is disposed in a spacer structure for packaging, and a connection pad, a first metallic layer, an insulating layer, a wiring layer, a pin base, a conductive via and a metallic bump are formed on the semiconductor die, wherein the wiring layer can be formed as a single layer or multiple layers, and the connection pad is electrically connected with an outer pin. Moreover, the positioning structures are also formed to overcome the conventional misalignment problems caused by the thermal expansion and the cooling contraction. The alignment of the conductive via with the connection pad can be more accurately achieved, which ensures that the connection pad is reliably connected with the outer pin.

6 Claims, 8 Drawing Sheets

SEMICONDUCTOR PACKAGE STRUCTURE AND METHOD FOR MANUFACTURING THE SAME

BACKGROUND OF THE INVENTION

1. Field of the Invention

The present invention relates to a semiconductor package structure and a method for manufacturing the same, and more particularly to a semiconductor package structure and a method for manufacturing the same in which an under bump metallurgy (UBM) layer is not needed to greatly reduce the manufacturing cost, and a conductive via is formed before cutting a semiconductor wafer, and the positioning structures are provided to overcome the conventional misalignment problems.

2. The Prior Arts

The conventional flip chip packaging usually connects the connection pads of a semiconductor die with a carrier board or lead frame through the metallic bumps. In a conventional method, an under bump metallurgy layer is formed between the metallic bumps and the connection pads of the semiconductor die.

Conventionally, the under bump metallurgy layer includes an adhesive layer, a barrier layer and a wetting layer sequentially stacked on the connection pad. The metallic bump can be a tin-lead bump, gold bump, copper bump, or metallic alloy bump.

As described in U.S. Pat. No. 5,508,229, a solder bump in a semiconductor device is only suitably used in an entire wafer. During the photolithography process, the alignment marks left from a previous wafer-processing step are used for the formation of an under bump metallurgy layer.

In some conventional methods, the entire wafer is not used for electroplating the metallic bump or connecting the wire lines. Instead of using the entire wafer, the wafer is cut into a plurality of semiconductor dies. Each single semiconductor die then is positioned, and allows its wiring surface affixed to an adhesive tape. Resin injection or thermal pressing is then applied to the back surface of the semiconductor die. The laser cutting or other methods then can be performed to form a blind hole to expose the connection pad of the semiconductor die on the adhesive tape. A metallic layer then can be formed by ion sputtering or chemical evaporation-plating as described in U.S. Pat. Nos. 5,353,498 and 7,067,356, or by chemical plating as described in U.S. Pat. No. 7,067,356. Alternatively, a metallic foil can be disposed on the adhesive tape, and a metallic film then can be formed in the blind hole by chemical immersion plating as described in U.S. Pat. No. 6,991,966. Subsequently, the connection pad and the outer pin can be electrically connected by a conventional method for manufacturing a printed circuit board.

In the conventional methods, the reference marks and the holes have to be firstly formed on the core board. The semiconductor die then can be positioned by using the reference marks. An encapsulating step then can be performed, and a conductive via is formed to expose the connection pad of the semiconductor die. The steps of resin injection or thermal pressing are usually performed under a high temperature condition. However, because the semiconductor die, the adhesive tape, and the core board have different coefficients of thermal expansion, the displacements may occur among these different elements during heating and cooling. As a result, the formation of the conductive via may be misaligned with the connection pad, which may affect the package quality.

Accordingly, there is a need to provide a new flip-chip packaging method without using an under bump metallurgy layer which can be applied to semiconductor wafers and/or semiconductor dies. In addition, in the new flip-chip packaging method, the semiconductor dies is not needed to be fixed on the adhesive tape before the steps of resin injection or thermal pressing so that the misalignment problem can be prevented, which is caused by the different coefficients of thermal expansion for the semiconductor die, the adhesive tape and the core board.

SUMMARY OF THE INVENTION

An objective of the present invention is to provide a semiconductor package structure that comprises a semiconductor die, a connection pad, a passivation layer, a first metallic layer, an insulating layer, a wiring layer, a pin base, a metallic bump, an insulating board and a bonding pad. The insulating board is formed on the bonding pad, and includes a plurality of cavities. The semiconductor die is disposed in one of the cavities. The connection pad is disposed on a wiring layer of the semiconductor die. The semiconductor die has a bottom surface, which is opposite to the wiring surface, connected with the bonding pad. The passivation layer covers the wiring layer of the semiconductor die, and has an opening through which an upper surface of the connection pad is exposed.

The first metallic layer is formed on the upper surface of the connection pad. The insulating layer is formed on the passivation layer and the first metallic layer, and has a conductive via through which the first metallic layer is exposed. The wiring layer is formed on a portion of the surface of the insulating layer, and covers a sidewall of the conductive via to connect with the first metallic layer. The pin base is disposed on the wiring layer. The metallic bump is connected with the pin base, and contacts with the wiring layer to electrically connect the connection pad on the semiconductor die and an external circuit board.

A second insulating layer is further formed on the wiring layer. The second insulating layer has an opening through which the wiring layer is partially exposed. An outer wiring layer is also respectively formed on a portion of the surface of the second insulating layer and a sidewall of the opening, and the outer wiring layer is electrically connected with the wiring layer. This structure can be successively stacked up. The pin base can be disposed on the outmost wiring layer, and the metallic bump can be connected with the pin base. The pin base is in contact with the outer wiring layer to electrically connect the connection pad of the semiconductor die with the external circuit board.

Another objective of the present invention is to provide a method for manufacturing a semiconductor package structure. The method comprises preparing a semiconductor wafer, forming a first metallic layer, forming an insulating layer, forming a conductive via and a plurality of positioning structures, cutting a semiconductor die from the semiconductor wafer, aligning and pressing steps, forming a second metallic layer, forming a wiring layer, and connecting a metallic bump. The prepared semiconductor wafer includes at least one semiconductor die, and each semiconductor die has at least one connection pad and a passivation layer. The connection pad is formed on a wiring surface of the semiconductor die, and the passivation layer covers the wiring surface of the semiconductor die and including one opening through which an upper surface of the connection pad is exposed.

The first metallic layer is formed on the connection pad. The insulating layer is formed on the semiconductor wafer. The conductive via is formed through the insulating layer to expose the first metallic layer, and the positioning structures are formed to facilitate subsequent alignment. The semiconductor die is then cut out from the semiconductor wafer. In the following aligning and pressing steps, the semiconductor die is disposed in a spacer structure, and the spacer structure includes an insulating board, and a bonding pad affixed with the insulating board. The insulating board includes a plurality of cavities for receiving the semiconductor dies, and a plurality of alignment marks disposed around the cavities and at an outer periphery of the spacer structure. The alignment marks is associated with the positioning structures to ensure the proper alignment. Once the alignment is achieved, the surfaces of the insulating board and the insulating layer are at the same horizontal plane.

The second metallic layer is formed on the insulating layer and the insulating board. The second metallic layer is also formed on the sidewall of the conductive via formed through the insulating layer to connect with the first metallic layer. The wiring layer is formed by patterning the second metallic layer. In the step of connecting a metallic bump, a pin base is disposed on the wiring layer, and a metallic bump is then formed on the pin base to be electrically connected with the connection pad of the semiconductor die. The semiconductor package structure can be thereby completed.

In some embodiments, the method of the present invention further comprises performing one or more times a step of stacking a wiring layer before the step of connecting the metallic bump. The step of stacking the wiring layer comprises forming a second insulating layer on the wiring layer and the insulating layer, forming an opening through the second insulating layer through which the wiring layer is partially exposed, and forming an outer metallic layer on the second insulating layer. The outer metallic layer also covers the sidewall of the opening formed through the second insulating layer so that the outer metallic layer is electrically connected with the wiring layer. The outer metallic layer is then patterned to form an outer wiring layer.

The advantages of the semiconductor package structure and the manufacturing method thereof according to the present invention include: forming a structure including the connection pad, and the first and second metallic layers on the semiconductor die so that the connection pad can be electrically connected to the outer pins. Accordingly, the connection pad can be electrically connected to the outer pins without an under bump metallurgy layer. Moreover, the conductive via can be formed at the proper position by using the alignment marks and the positioning structures of the semiconductor die. Accordingly, the misalignment caused by the thermal expansion and cooling contraction during the resin filling and thermal pressing steps can be prevented, which can improve the alignment between the conductive via and the connection pad. As a result, the electrical connection between the connection pad and the outer pins can be more reliable.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENTS

Figure 1A:
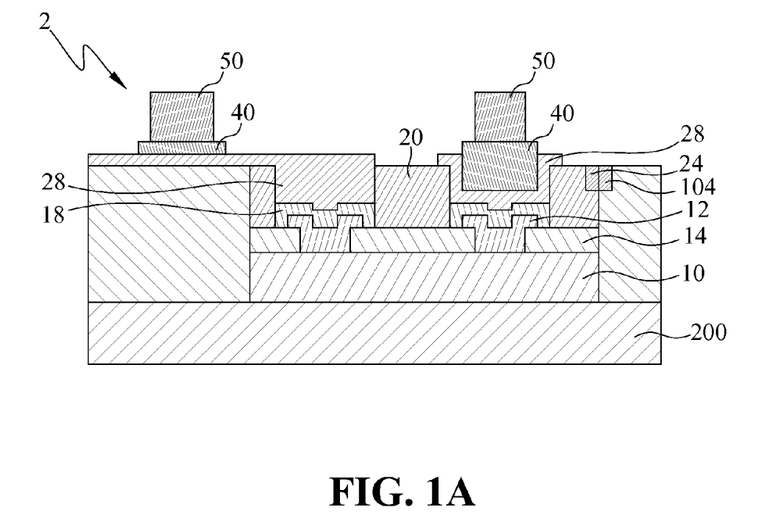
FIG. 1A is a cross-sectional view of a semiconductor package structure according to the first embodiment of the present invention.

FIG. 1A is a cross-sectional view showing a semiconductor package structure according to the first embodiment of the present invention. As shown in FIG. 1A, a semiconductor package structure 2 comprises a semiconductor die 10, the first metallic layer 18, an insulating layer 20, a wiring layer 28, at least one pin base 40, at least one metallic bump 50, an insulating board 100, and a bonding pad 200. At least one connection pad 12 and a passivation layer 14 are formed on the semiconductor die 10. The insulating board 100 is formed on the bonding pad 200, and includes a plurality of cavities and a plurality of alignment marks 104. The semiconductor die 10 can be disposed in one of the cavities in the insulating board 100. For clarity, FIG. 1A only shows one semiconductor die 10 disposed in one cavity of the insulating board 100. The connection pad 12 can be disposed on a wiring surface of the semiconductor die 10. The bottom surface of the semiconductor die 10, which is opposite to the wiring surface, is connected to the bonding pad 200. The passivation layer 14 covers the wiring surface of the semiconductor die 10, and has at least one opening through which the upper surface of the connection pad 12 is exposed. The insulating layer 20 has at least one positioning structure 24 corresponding to the alignment marks 104.

The first metallic layer 18 is formed on the upper surface of the connection pad 12. The insulating layer 20 is formed on portions of the passivation layer 14 and the first metallic layer 18, and includes a conductive via through which the first metallic layer 18 is exposed. The wiring layer 28 is formed on a portion of the surface of the insulating layer 20 and is connected with the first metallic layer 18. The wiring layer 28 can fill in the conductive via, or covers the sidewall of the conductive via. Moreover, the wiring layer 28 can also extend from the insulating layer 20 to the surface of the insulating board 100. The pin base 40 is in contact with the wiring layer 28. The pin base 40 can be disposed on the conductive via, or at a suitable position on the wiring layer 28 spaced away from the conductive via. The metallic bump 50 can be formed on the pin base 40, and is used for electrically connecting the connection pad 12 of the semiconductor die 10 to an external circuit board (not shown).

The connection pad 12 is made of copper, aluminum, or an alloy thereof. The first metallic layer 18 is made of copper or nickel. When the connection pad 12 is made of aluminum or an alloy thereof, a zinc layer (not shown) can be formed between the connection pad 12 and the first metallic layer 18 to enhance the bonding of the first metallic layer 18. The wiring layer 28 is made of at least one of copper, nickel, gold, silver and tin. The pin base 40 is formed on the wiring layer 28. A metallic layer can be formed on the pin base 40 to enhance the bonding of the pin base 40 to the metallic bump 50, and the metallic layer is made of at least one of copper, gold, silver, tin and nickel, and the metallic bump 50 is made of at least one of copper, gold, silver, tin, and nickel.

Figure 1B:
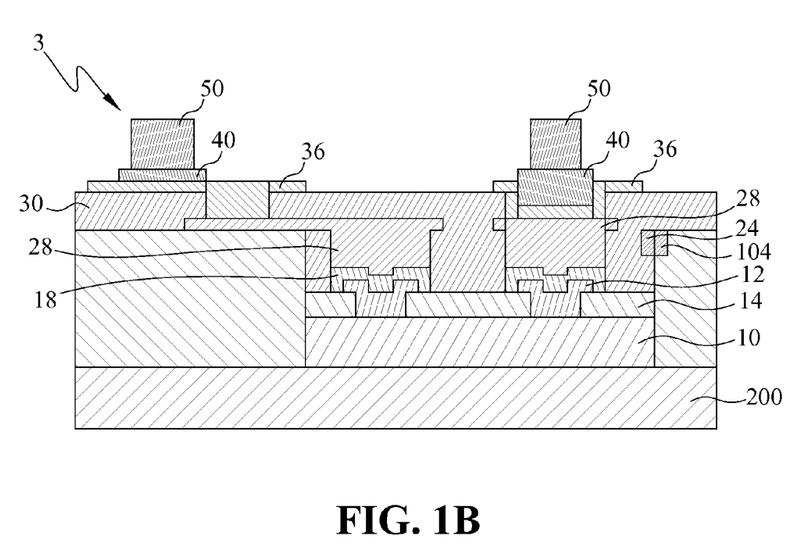
FIG. 1B is a cross-sectional view of a semiconductor package structure according to the second embodiment of the present invention.

FIG. 1B is a cross-sectional view showing a semiconductor package structure according to the second embodiment of the present invention. As shown in FIG. 1B, the semiconductor package structure 3 of the second embodiment is similar to the semiconductor package structure 2 of the first embodiment. The main difference is in that a second insulating layer 30 having at least one opening is formed on the wiring layer 28, and an outer wiring layer 36 is formed on the second insulating layer 30. The outer wiring layer 36 is formed on the surface of the second insulating layer 30, and is connected to the wiring layer 28. The outer wiring layer 36 can fill in the opening, or a cover layer can be formed on the sidewall of the opening. As the first embodiment, the pin base 40 can be in contact with the outer wiring layer 36. The pin base 40 can be disposed on the opening, or spaced away from the opening. The metallic bump 50 is connected to the pin base 40 so that the connection pad of the semiconductor die 10 is electrically connected to an external circuit board (not shown).

Figure 2:
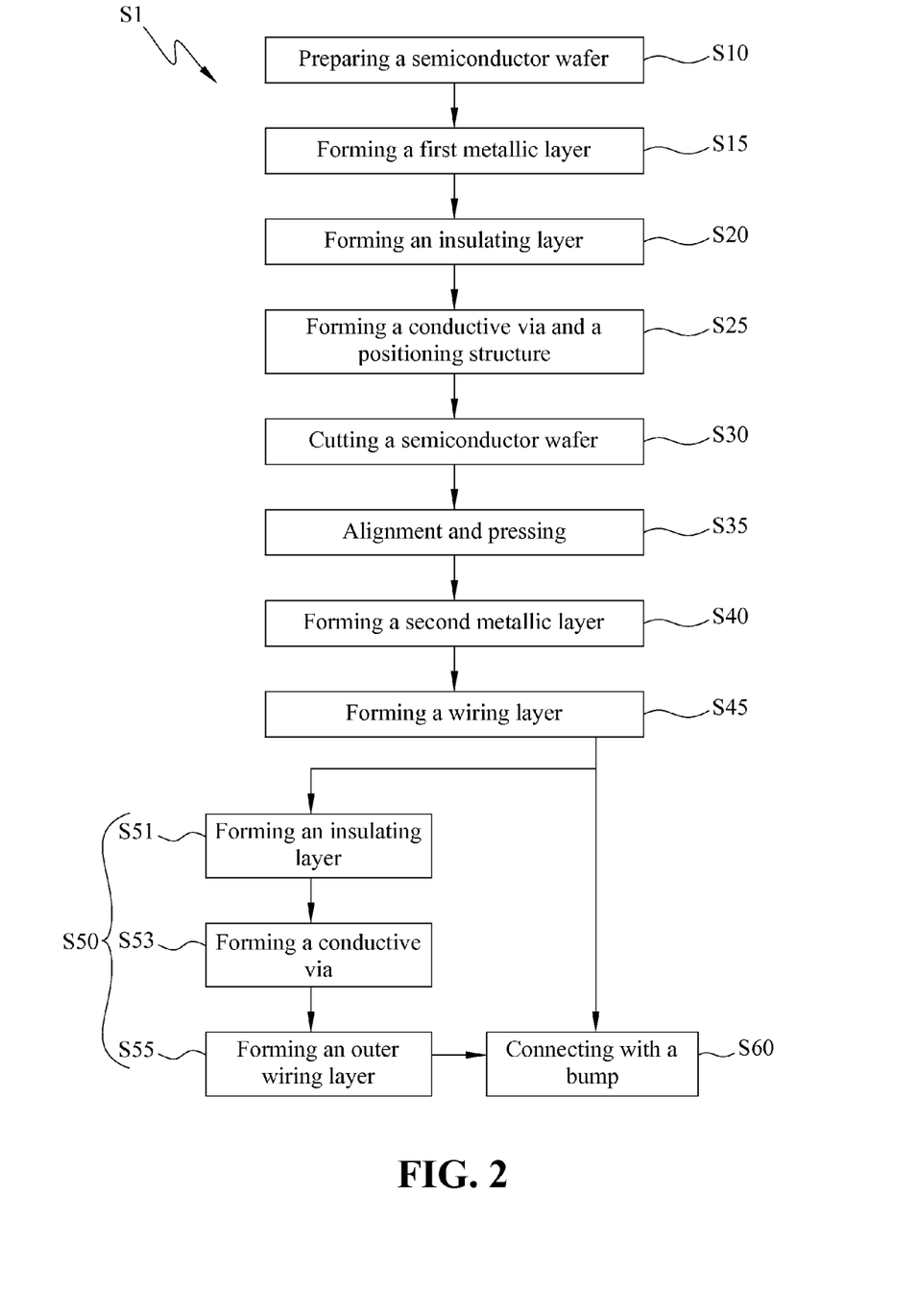
FIG. 2 is a flowchart showing the steps of the method for manufacturing a semiconductor package structure according to the present invention.

FIG. 2 is a flowchart showing the steps of the method for manufacturing a semiconductor package structure according to the present invention. FIGS. 3A-3I and FIGS. 4A-4E are the cross-sectional views showing the steps of a method for manufacturing a semiconductor package structure according to the present invention. Referring to FIG. 2, a method for manufacturing a semiconductor package structure 51 comprises a step S10 of preparing a semiconductor wafer, a step S15 of forming a first metallic layer, a step S20 of forming an insulating layer, a step S25 of forming a conductive via and a positioning structure, a step S30 of cutting a semiconductor wafer, a step S35 of alignment and pressing, a step S40 of forming a second metallic layer, a step S45 of forming a wiring layer, and a step S60 of connecting with a bump.

Figure 3A:
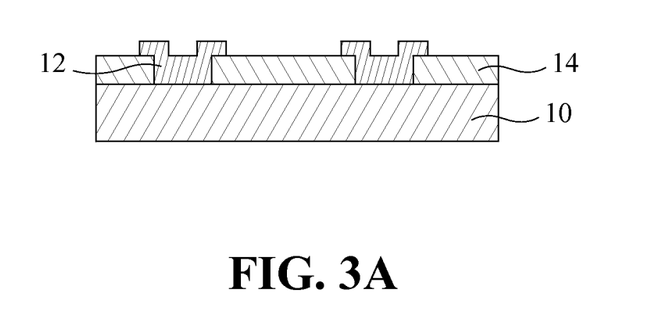
FIGS. 3A-3I and FIGS. 4A-4E are the cross-sectional views showing the steps of a method for manufacturing a semiconductor package structure according to the present invention.

In step S10, a semiconductor wafer is prepared, including a plurality of semiconductor dies 10 as shown in FIG. 3A. Each of the semiconductor dies 10 has at least one connection pad 12 and a passivation layer 14. The connection pad 12 is formed on the wiring surface of the semiconductor die 10. The passivation layer 14 covers the wiring surface of the semiconductor die 10, but includes at least one opening through which the upper surface of the connection pad 12 is exposed.

Figure 3B:
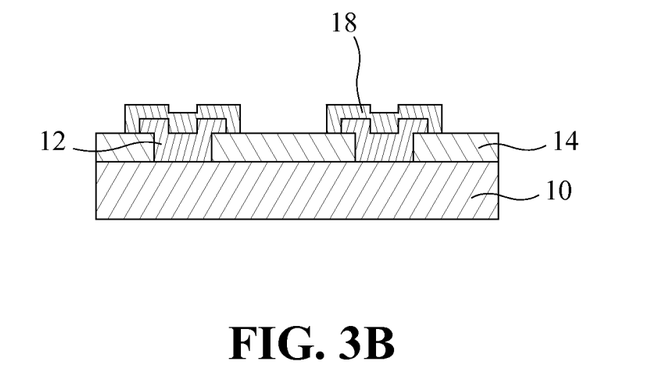
Figure 3C:
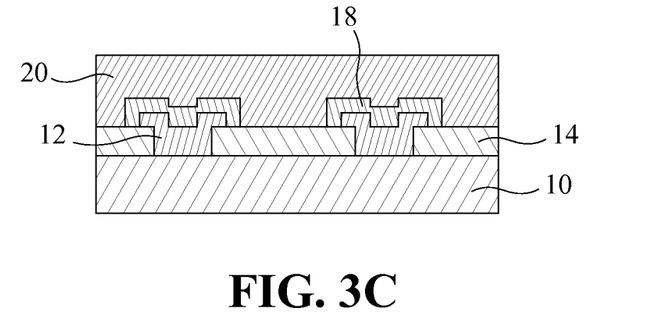
Figure 3D:
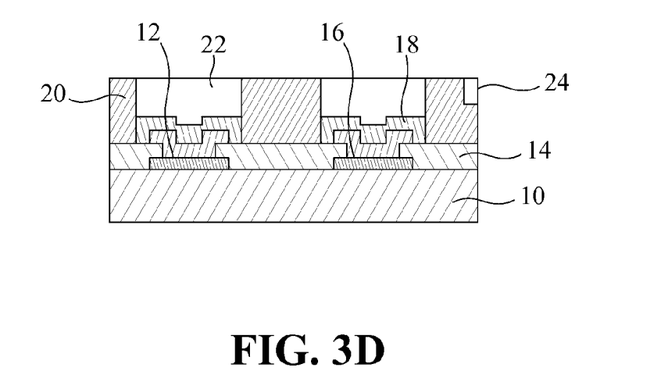

As shown in FIG. 3B, in step S15, the first metallic layer 18 is formed on the connection pad 12 by an immersion plating method. As shown in FIG. 3C, in step S20, the insulating layer 20 is formed on the first metallic layer 18 and the passivation layer 14. As shown in FIG. 3D, in step S25, a conductive via 22 is formed through the insulating layer 20 to expose the first metallic layer 18, and the positioning structure 24 is formed to facilitate the subsequent alignment step.

Figure 3E:
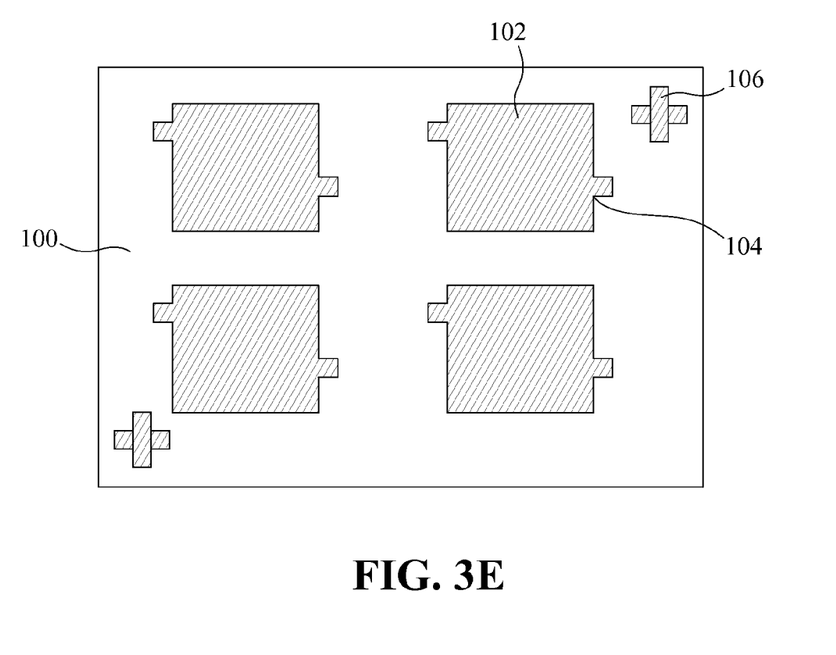
Figure 3F:
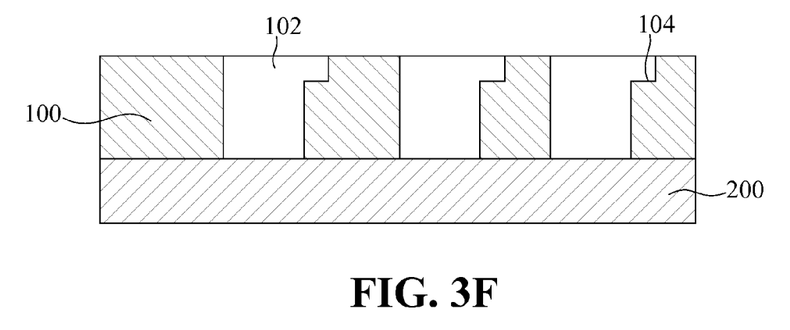

In step S30, the semiconductor die 10 is cut out from the semiconductor wafer. In step S35, the semiconductor die 10 is disposed in a spacer structure as shown in FIGS. 3E and 3F. The spacer structure includes the insulating board 100 and the bonding pad 200. The insulating board 100 is fixed on the bonding pad 200, and includes a plurality of cavities 102. Each semiconductor die 10 is disposed in one of cavities 102, such that the bottom surface of the semiconductor die 10, which is opposite to its wiring surface, is connected with the bonding pad 200. As shown in FIG. 3E, the insulating board 100 includes the alignment marks 104 at the periphery of the cavity 102 which can be aligned with the positioning structures 24, respectively. Once the alignment process is completed, the surfaces of the insulating board 100 and the insulating layer 20 are at the same horizontal level. Subsequently, the semiconductor die 10 and the insulating board 100 are bonded with each other by the bonding pad 200 using a thermal pressing method. Meanwhile, a resin is filled in the positioning structures 24 and the alignment marks 104 so that the positioning structures 24 and the alignment marks 104 are at the same horizontal level as the insulating layer 20. Further, a board alignment structure 106 is provided at an outer periphery of the insulating board 100 to facilitate the alignment of the insulating board 100 with the process equipment.

Figure 3G:
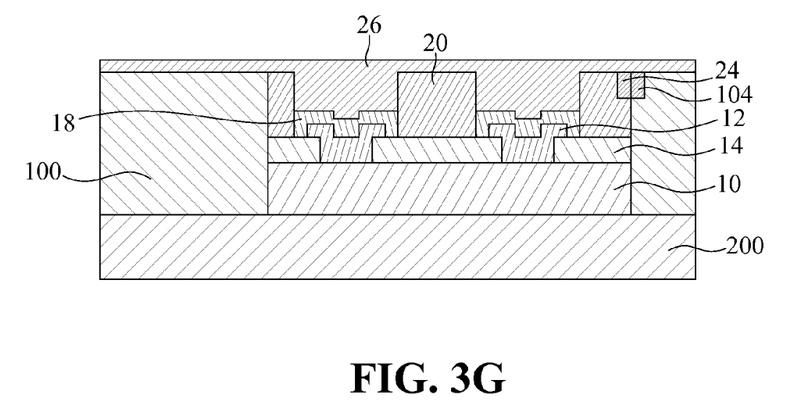
Figure 3H:
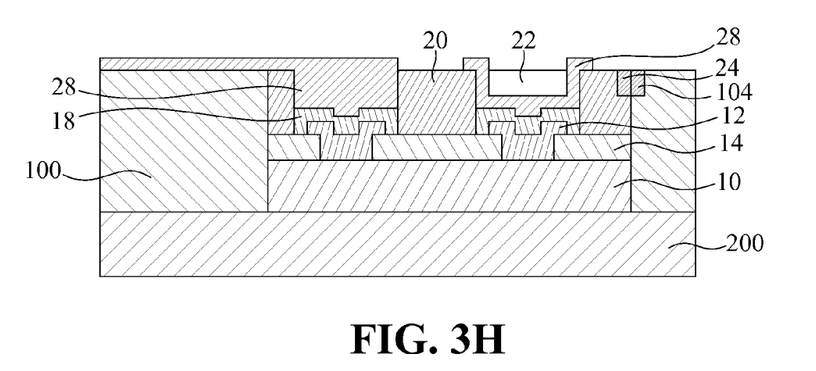
Figure 3I:
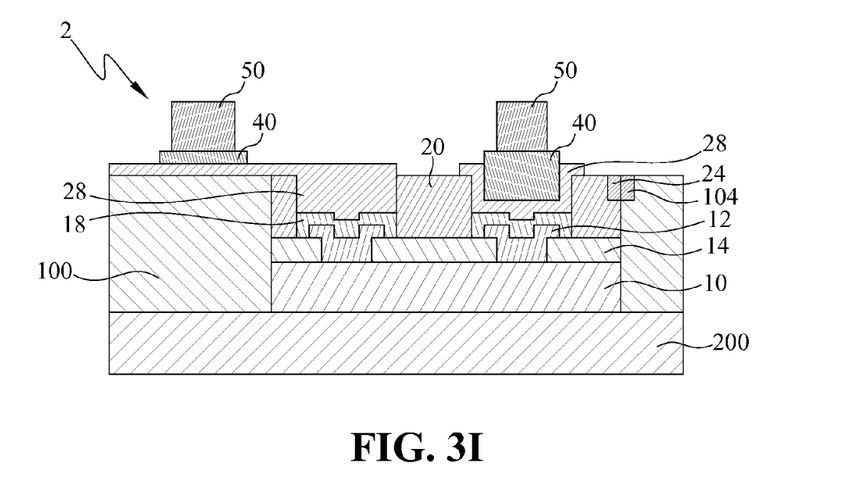

As shown in FIG. 3G, in step S40, the second metallic layer 26 is formed on the surfaces of the insulating layer 20 and the insulating board 100 by sputtering deposition, electroplating, or chemical immersion plating. The second metallic layer 26 can also be formed on the sidewall of the conductive via 22, or fully filled in the conductive via 22 so that the second metallic layer 26 can be electrically connected with the first metallic layer 18. As shown in FIG. 3H, in step S45, the second metallic layer 26 is patterned by a photolithography process to form the wiring layer 28. As shown in FIG. 3I, in step S60, the pin base 40 can be disposed in the conductive via 22 which is already covered with the second metallic layer 26, or disposed at a position spaced away from the conductive via 22. Then a metallic bump 50 is formed on the pin base 40 such that the connection pad 12 can be connected to its corresponding metallic bump 50, and thereby the semiconductor package structure 2 is completed. Furthermore, when the pin base 40 is not disposed on the conductive via 22, a recess (not shown) can be formed under the pin base 40 so that the metallic bump 50 can be securely held.

Figure 4A:
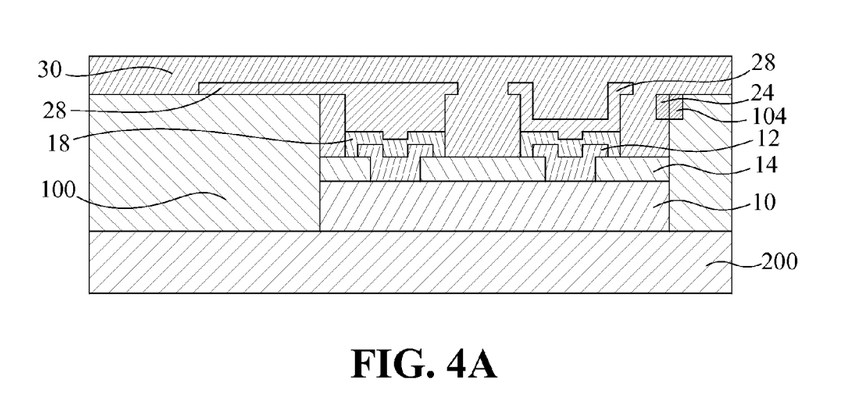
Figure 4B:
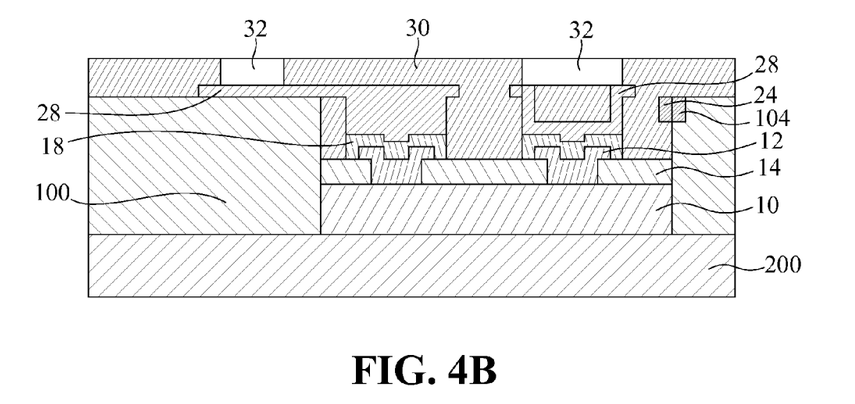
Figure 4C:
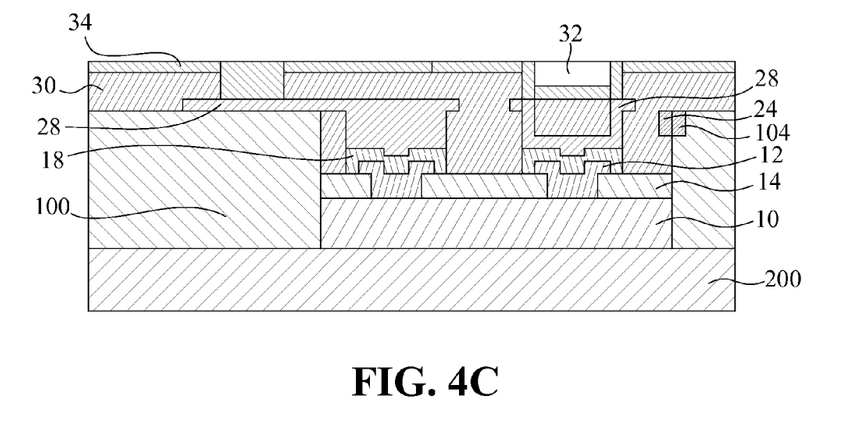
Figure 4D:
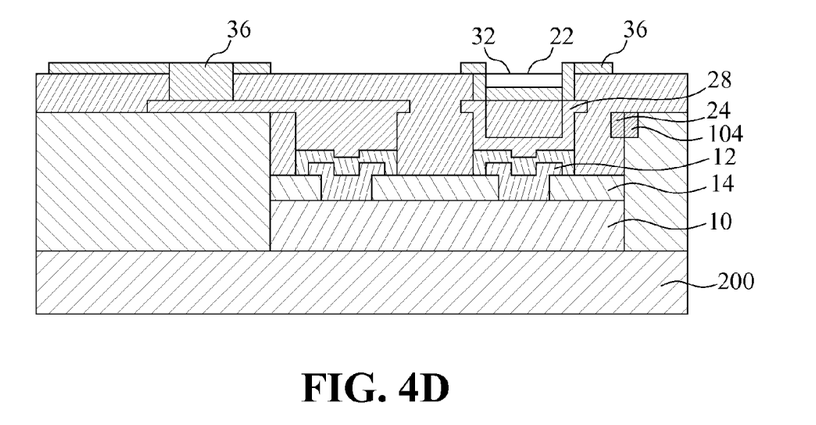

Furthermore, before the step S60, the method for manufacturing a semiconductor package structure S1 can further include carrying out one or more times of a step S50 of stacking a wiring layer. The step S50 includes a sub-step S51 of forming an insulating layer, a sub-step S53 of forming a conductive via, and a sub-step S55 of forming an outer wiring layer. In sub-step S51, a second insulating layer 30 is formed on the wiring layer 28 and the insulating layer 20, as shown in FIG. 4A. In sub-step S53, at least one opening 32 is formed in the second insulating layer 30 to partially expose the wiring layer 28, as shown in FIG. 4B. In sub-step S55, an outer metallic layer 34 is formed on the second insulating layer 30. The outer metallic layer 34 can be formed on the sidewall of the opening 32 or fully filled in the opening 32 so that the outer metallic layer 34 can be electrically connected with the wiring layer 28, as shown in FIG. 4C. Then, the outer metallic layer 34 is patterned by a photolithography process to form the outer wiring layer 36 as shown in FIG. 4D.

Figure 4E:
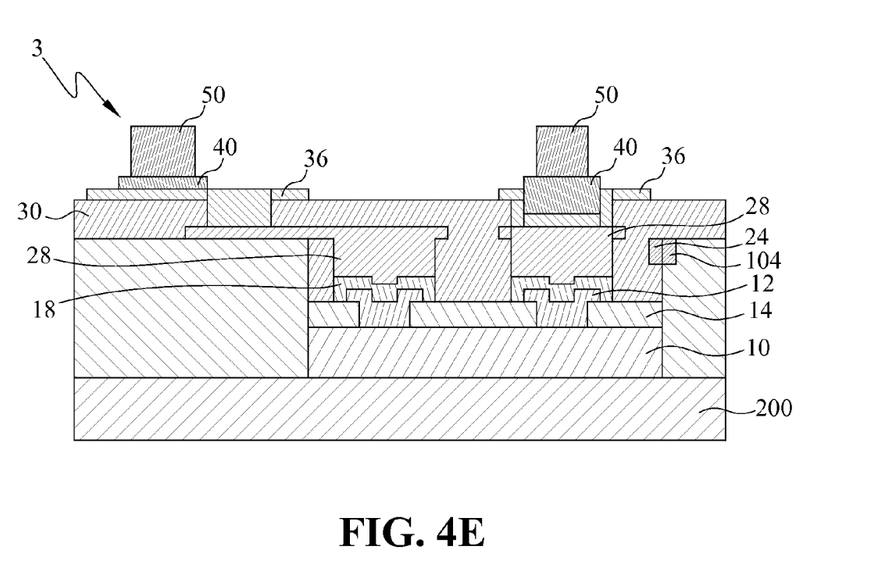

In the above embodiment of the present invention, the step S50 is only performed once. However, the step S50 can be repeated a number of times to form a stack of wiring layers according to the required wiring density of the wiring layers. After step S50 is completed, as shown in FIG. 4E, the pin base 40 is disposed in the recess of the opening 32 covered with the outer wiring layer 36, or spaced away from the opening 32. Then, a metallic bump 50 is formed on the pin base 40 to complete the semiconductor package structure 3.

The first metallic layer 18 is formed by chemical immersion plating, and the second metallic layer 26 is formed by sputtering deposition, electroplating, electroless plating, or chemical immersion plating, wherein the electroless nickel plating or the electroless copper plating is preferred. When the connection pad 12 is made of aluminum or an aluminum alloy, a plating layer (not shown) can be formed by electroless plating between the connection pad 12 and the first metallic layer 18 to enhance the bonding of the first metallic layer 18 which is subsequently formed. The plating layer is made of zinc formed by chemical immersion plating. Furthermore, a metallic particle layer (not shown) can be formed on the surfaces of the insulating layer 20, the insulating board 100, and the second insulating layer 30 to enhance the bonding of the wiring layer 28 and/or outer wiring layer 36 to the insulating layer 20 and/or insulating board 100 and/or the second insulating layer 30. The metallic particle layer can be a polymer film dispersed with the metallic copper or nickel particles. Furthermore, when the pin base 40 is not disposed on the conductive via 22 and/or the opening 32, a recess (not shown) can be formed under the pin base 40 so that the metallic bump 50 can be securely held.

The advantages of the semiconductor package structure and the manufacturing method thereof according to the present invention include: forming a structure including the connection pad, and the first and second metallic layers on the semiconductor die so that the connection pad can be electrically connected to the outer pins. Accordingly, the connection pad can be electrically connected to the outer pins without an under bump metallurgy layer. Moreover, the conductive via can be formed at the proper position by using the alignment marks and the positioning structures of the semiconductor die. Accordingly, the misalignment caused by the thermal expansion and cooling contraction during the resin filling and thermal pressing steps can be prevented, which can improve the alignment between the conductive via and the connection pad. As a result, the electrical connection between the connection pad and the outer pins can be more reliable.

From the foregoing description of one embodiment of the invention, it will be apparent that numerous variations will be apparent to those skilled in the art without departing from the spirit and scope of the invention. Accordingly, it is to be understood that the foregoing description is intended to be illustrative of the principles of the invention rather than exhaustive thereof, and that the true invention is not intended to be limited thereby, nor limited in scope other than as expressly set forth in the following claims.

What is claimed is:

1. A semiconductor package structure comprising:
    a bonding pad;
    an insulating board affixed on the bonding pad, and having a plurality of cavities and a plurality of alignment marks;
    at least one semiconductor die disposed in one of the cavities, at least one connection pad and a passivation layer being formed on the semiconductor die, and a bottom surface of the semiconductor die being connected to the bonding pad;
    a first metallic layer formed on a surface of the connection pad;
    an insulating layer formed on the passivation layer and the first metallic layer, and having at least one conductive via through which the first metallic layer is exposed;
    a wiring layer formed on a surface of the insulating layer and in the conductive via, the wiring layer being connected with the first metallic layer;
    at least one pin base disposed on the wiring layer; and
    at least one metallic bump connected to the pin base, the metallic bump electrically connecting the connection pad with an outer circuit board,
    wherein the connection pad is disposed on a wiring surface of the semiconductor die, which is opposite to the bottom surface of the semiconductor die, and the passivation layer covers the wiring surface of the semiconductor die and has a plurality of openings through which an upper surface of the connection pad is exposed, and the passivation layer includes at least one positioning structure corresponding to the alignment marks.

2. The semiconductor package structure of claim 1, wherein the wiring layer fills up the conductive via, or covers a sidewall of the conductive via, and the pin base is disposed in the conductive via or at a position of the wiring layer spaced away from the conductive via, and a recess is formed under the pin base so that the metallic bump is securely held.

3. The semiconductor package structure of claim 1, wherein an upper surface of the wiring layer further comprises:
    a second insulating layer having at least one opening through which the wiring layer is partially exposed;
    an outer wiring layer disposed on a surface of the second insulating layer and in the opening, the outer wiring layer being in contact with the wiring layer;
    wherein the outer wiring layer fills up the opening, or covers a sidewall of the opening, and the pin base is disposed on the outer wiring layer, and the pin base is disposed in the opening which is not filled up with the wiring layer, or at a position spaced away from the opening.

4. The semiconductor package structure of claim 1, wherein the wiring layer extends to a surface of the insulating board.

5. The semiconductor package structure of claim 1, further including a metallic particle layer disposed between the insulating layer and the wiring layer, and/or between the second insulating layer and the outer wiring layer, and the metallic particle layer is a polymer film dispersed with a plurality of metallic particles.

6. The semiconductor package structure of claim 1, wherein the first metallic layer is formed by chemical immersion plating, and when the surface of the connection pad is made of aluminum or aluminum alloy, a zinc layer is formed between the connection pad and the first metallic layer by electroless plating, wherein the wiring layer, the pin base and the metallic bump are made of at least one of copper, gold, silver, tin, and nickel.

* * * * *